(12) United States Patent
Nishimura

(10) Patent No.: US 10,879,139 B2
(45) Date of Patent: Dec. 29, 2020

(54) SEMICONDUCTOR DEVICE, POWER CONVERTER, AND METHOD OF MANUFACTURING SEMICONDUCTOR DEVICE

(71) Applicant: Mitsubishi Electric Corporation, Tokyo (JP)

(72) Inventor: Takahiro Nishimura, Tamba (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/514,834

(22) Filed: Jul. 17, 2019

(65) Prior Publication Data
US 2020/0083127 A1 Mar. 12, 2020

(30) Foreign Application Priority Data
Sep. 6, 2018 (JP) ................. 2018-166997

(51) Int. Cl.
| | | |
|---|---|---|
| *H01L 23/055* | (2006.01) | |
| *H01R 4/02* | (2006.01) | |
| *H02M 7/44* | (2006.01) | |
| *H02M 7/00* | (2006.01) | |
| *H01L 21/52* | (2006.01) | |
| *H01L 23/053* | (2006.01) | |

(Continued)

(52) U.S. Cl.
CPC ............ *H01L 23/055* (2013.01); *H01L 21/52* (2013.01); *H01L 23/045* (2013.01); *H01L 23/053* (2013.01); *H01L 23/057* (2013.01); *H01R 4/029* (2013.01); *H02M 7/003* (2013.01); *H02M 7/44* (2013.01); *H01L 23/4822* (2013.01)

(58) Field of Classification Search
CPC ... H01L 21/52; H01L 23/045; H01L 23/0453; H01L 23/055; H01L 23/057; H01L 23/4822; H01L 24/28–24/33; H02M 7/003; H01R 4/029
See application file for complete search history.

(56) References Cited

U.S. PATENT DOCUMENTS

| | | | |
|---|---|---|---|
| 6,294,255 B1* | 9/2001 | Suzuki ................. | H01R 12/62 174/88 R |
| 6,512,175 B2* | 1/2003 | Gutierrez ............. | H01L 23/057 174/538 |

(Continued)

FOREIGN PATENT DOCUMENTS

| | | |
|---|---|---|
| JP | 2011-103367 A | 5/2011 |
| JP | 2015-119072 A | 6/2015 |

*Primary Examiner* — David A Zarneke
(74) *Attorney, Agent, or Firm* — Studebaker & Brackett PC

(57) ABSTRACT

A first portion of an element-side terminal of a semiconductor element includes a projection. A second portion of the case-side terminal of a case includes a recess which comes into contact with a projection. The projection includes a first end surface and a second end surface continuous with the top surface. The recess includes a first lateral surface which is in continuous with a bottom surface and is in contact with the first end surface, and a second lateral surface which is in contact with the bottom surface and is in contact with the second end surface. As viewed from a lateral wall side, the first end surface and the first lateral surface are inclined in a first direction, and the second end surface and the second lateral surface are inclined in a second direction intersecting the first direction.

7 Claims, 11 Drawing Sheets

(51) Int. Cl.
*H01L 23/057* (2006.01)
*H01L 23/045* (2006.01)
*H01L 23/482* (2006.01)

(56) References Cited

U.S. PATENT DOCUMENTS

| | | | | |
|---|---|---|---|---|
| 6,531,676 | B2 * | 3/2003 | Schwemmer | H01R 43/0221 219/121.64 |
| 7,128,620 | B2 * | 10/2006 | Maura | H01H 1/5822 439/874 |
| 7,214,881 | B2 * | 5/2007 | Nelson | H01R 4/029 174/94 R |
| 7,425,135 | B2 * | 9/2008 | Liu | H05K 3/361 439/67 |
| 8,430,699 | B2 * | 4/2013 | Ishida | H01R 4/029 439/874 |
| 9,793,050 | B2 * | 10/2017 | Inazumi | H02M 7/003 |
| 2015/0179539 | A1 | 6/2015 | Tamai | |

\* cited by examiner

SEMICONDUCTOR DEVICE, POWER CONVERTER, AND METHOD OF MANUFACTURING SEMICONDUCTOR DEVICE

BACKGROUND OF THE INVENTION

Field of the Invention

The present invention relates to a semiconductor device, a power converter, and a method of manufacturing a semiconductor device.

Description of the Background Art

A conventionally known semiconductor device includes a semiconductor element disposed in a case (e.g., see Japanese Patent Laying-Open No. 2011-103367). According to Japanese Patent Laying-Open No. 2011-103367, an element-side terminal of the semiconductor element and a case-side terminal of the case are bonded to each other by welding. Specifically, a first portion of the element-side terminal, which extends vertically along the lateral wall of the case, and a second portion of the case-side terminal, which extends along the lateral wall of the case, are welded while being in contact with each other.

In a conventionally known technique, in two terminals to be bonded, one projection is provided to a first terminal, a recess is provided to a second terminal stacked on the first terminal, and the projection is fitted into the recess, thereby aligning these two terminals with each other (e.g., see Japanese Patent Laying-Open No. 2015-119072).

SUMMARY OF THE INVENTION

Although the first portion of the element-side terminal and the second portion of the case-side terminal need to be reliably in contact with each other in order to reliably weld the element-side terminal and the case-side terminal for improved reliability in the semiconductor device disclosed in Japanese Patent Laying-Open No. 2011-103367, Japanese Patent Laying-Open No. 2011-103367 does not particularly describe alignment of these terminals. Also, the configuration disclosed in Japanese Patent Laying-Open No. 2015-119072 is used for alignment of terminals to be stacked, which is not applied to alignment of vertically extending terminals disclosed in Japanese Patent Laying-Open No. 2011-103367 without any change.

The present invention has been made to solve the above problem and has an object to provide a semiconductor device in which the occurrence of a misalignment between terminals is reduced and which has high reliability, a power converter, and a method of manufacturing such a semiconductor device.

A semiconductor device according to the present disclosure includes a semiconductor element, a case, and a case-side terminal. The semiconductor element has an element-side terminal. The case holds the semiconductor element therein and has a lateral wall. The case-side terminal is connected to the case. The element-side terminal and the case-side terminal are located in a region between the lateral wall and the semiconductor element and are connected to each other. A first portion of the element-side terminal which comes into contact with the case-side terminal extends along the lateral wall. The first portion includes a projection. A second portion of the case-side terminal which comes into contact with the element-side terminal extends along the lateral wall. The second portion includes a recess which comes into contact with the projection. The projection includes a top surface facing the lateral wall, a first end surface continuous with the top surface, and a second end surface continuous with the top surface. The recess includes a bottom surface facing the top surface of the projection, a first lateral surface which is continuous with the bottom surface and is in contact with the first end surface of the projection, and a second lateral surface which is continuous with the bottom surface and is in contact with the second end surface of the projection. As viewed from a lateral wall side, the first end surface and the first lateral surface extend to be inclined in a first direction, and the second end surface and the second lateral surface extend in a second direction intersecting the first direction.

A method of manufacturing a semiconductor device according to the present disclosure includes preparing a case including a semiconductor element having an element-side terminal and a case having a lateral wall. The case is connected with a case-side terminal. The element-side terminal includes a first portion to come into contact with the case-side terminal. The first portion includes a projection. The case-side terminal includes a second portion which faces the lateral wall and extends along the lateral wall. The second portion includes a recess to come into contact with the projection. The projection includes a top surface facing the lateral wall, a first end surface continuous with the top surface, and a second end surface continuous with the top surface. The recess includes a bottom surface facing the top surface of the projection, a first lateral surface which is continuous with the bottom surface and is to be in contact with the first end surface of the projection, and a second lateral surface which is in continuous with the bottom surface and is to be in contact with the second end surface of the projection. The method further includes disposing the semiconductor element in the case with the projection being in contact with the recess. In the disposing of the semiconductor element, as viewed from a lateral wall side, the first end surface and the first lateral surface extend to be inclined in a first direction, and the second end surface and the second lateral surface extend to be inclined in a second direction intersecting the first direction. The method further includes fixing the first portion and the second portion with the projection being in contact with the recess.

A power converter according to the present disclosure includes a main conversion circuit and a control circuit. The main conversion circuit has the semiconductor device and converts power supplied thereto and outputs the power. The control circuit outputs a control signal for controlling the main conversion circuit to the main conversion circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below in detail with reference to the drawings. The same or corresponding parts are designated by the same references, and description thereof will not be repeated.

Embodiment 1

<Configuration of Semiconductor Device>

Figure 1:
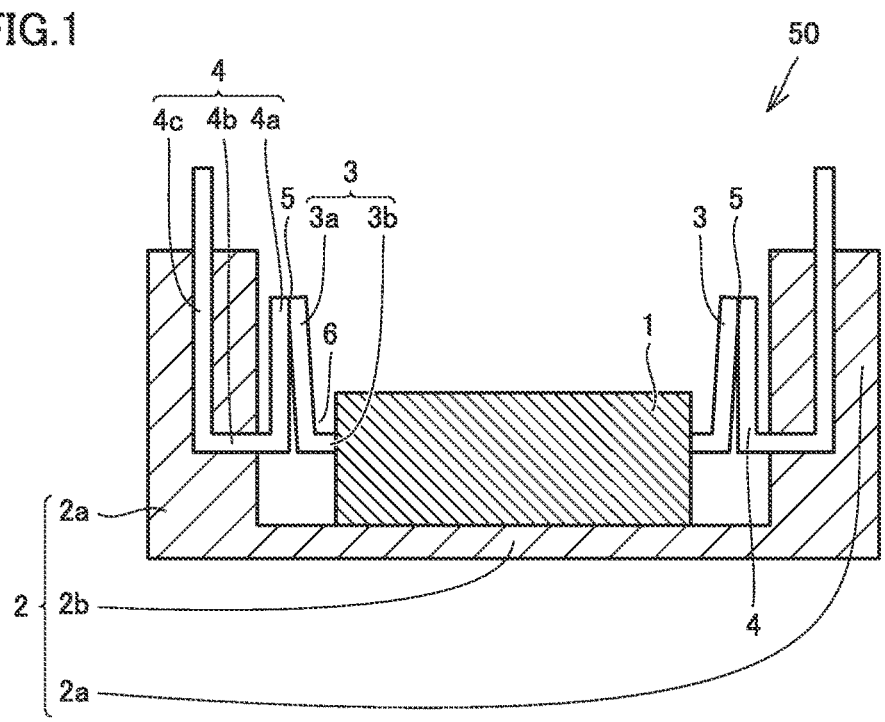
FIG. 1 is a schematic sectional view of a semiconductor device according to Embodiment 1.
Figure 2:
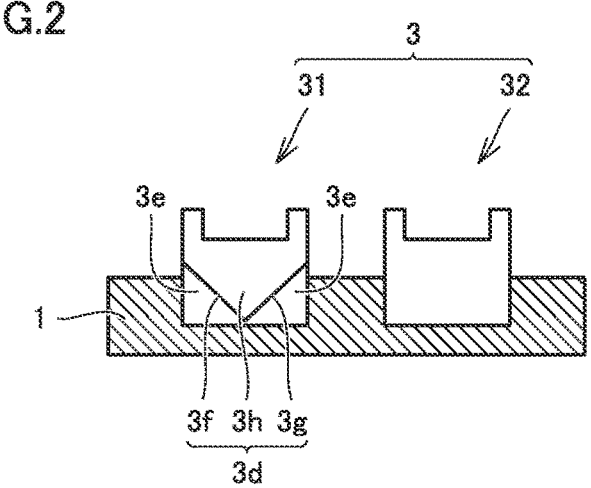
FIG. 2 is a schematic view of an element-side terminal in the semiconductor device of FIG. 1.
Figure 3:
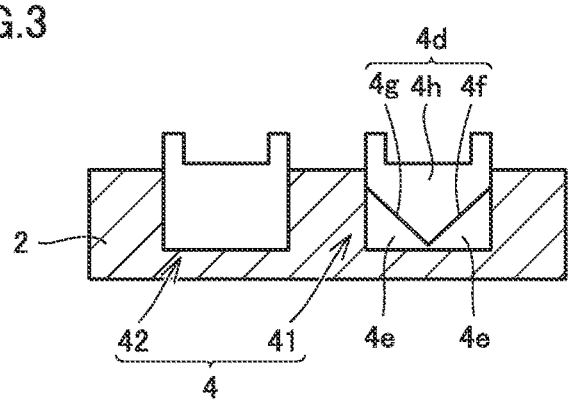
FIG. 3 is a schematic view of a case-side terminal in the semiconductor device of FIG. 1.
Figure 4:
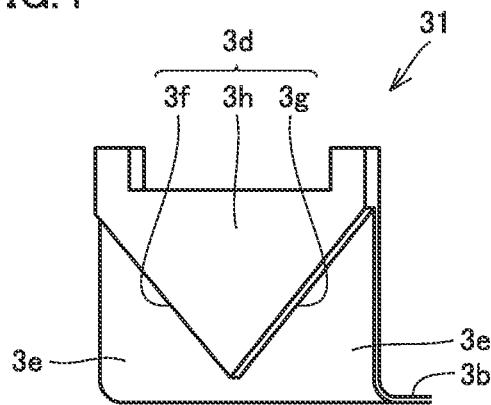
FIG. 4 is an enlarged schematic view of the element-side terminal shown in FIG. 2.
Figure 5:
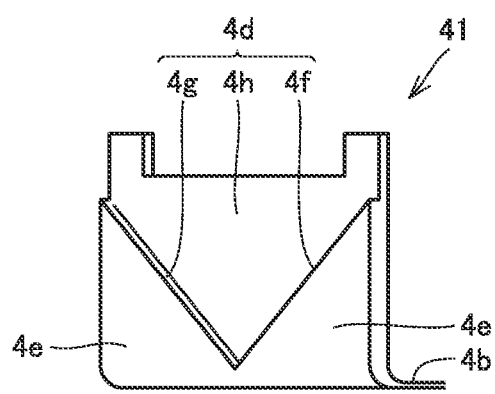
FIG. 5 is an enlarged schematic view of the case-side terminal shown in FIG. 3.

FIG. 1 is a schematic sectional view of a semiconductor device according to Embodiment 1. FIG. 2 is a schematic view of an element-side terminal in the semiconductor device of FIG. 1. FIG. 3 is a schematic view of a case-side terminal in the semiconductor device of FIG. 1. FIG. 4 is an enlarged schematic view of the element-side terminal shown in FIG. 2. FIG. 5 is an enlarged schematic view of the case-side terminal shown in FIG. 3.

A semiconductor device 50 shown in FIGS. 1 to 5 is used for, for example, an inverter that controls a motor or a regenerative converter of an electric vehicle or a train, and includes a semiconductor element 1 and a case 2. A case-side terminal 4 is disposed in case 2.

Semiconductor element 1 has an element-side terminal 3. In semiconductor element 1 shown in FIG. 1, element-side terminal 3 is disposed in each of two lateral surfaces. That is to say, semiconductor element 1 has a plurality of element-side terminals 3. Also, a plurality of element-side terminals are disposed in one lateral surface of semiconductor element 1, as shown in FIG. 2. Specifically, a first terminal 31 and a second terminal 32, which are element-side terminals 3, are disposed in one lateral surface of semiconductor element 1. Note that three or more element-side terminals 3 may be disposed in one lateral surface of semiconductor element 1. Element-side terminal 3 includes a connecting portion 3b projecting from the lateral surface of semiconductor element 1 and a first portion 3a extending vertically upward from the distal end of connecting portion 3b. In other words, first portion 3a that comes into contact with case-side terminal 4 in element-side terminal 3 extends along a lateral wall 2a.

Case 2 holds semiconductor element 1 therein. Case 2 can have any appropriate shape, which may be, for example, a quadrangular planar shape. Case 2 has a bottom surface 2b and lateral wall 2a. Lateral wall 2a is formed to surround the outer circumference of bottom surface 2b and extend vertically upward from the surface of bottom surface 2b.

Case-side terminal 4 is connected, to case 2. Specifically, case-side terminal 4 includes a second portion 4a facing first portion 3a of element-side terminal 3, a connecting portion 4b which is connected to second portion 4a and extends horizontally, and an external terminal portion 4c which is continuous with connecting portion 4b and extends vertically upward. Part of external terminal portion 4c and part of connecting portion 4b are buried in lateral wall 2a. The upper end of external terminal portion 4c projects from the top surface of lateral wall 2a of case 2. Connecting portion 4b extends from the inner circumferential surface of lateral wall 2a toward the inside of case 2. A plurality of case-side terminals 4 are disposed in case 2. Case-side terminals 4 as many as element-side terminals 3 are disposed in case 2 to allow case-side terminal 4 to be connected to element-side terminal 3.

First portion 3a of element-side terminal 3 and second portion 4a of case-side terminal 4 are located in a region between lateral wall 2a and semiconductor element 1. First portion 3a and second portion 4a are connected to each other. Specifically, they are connected to each other by welding the upper end of first portion 3a and the upper end of second portion 4a at a fixing portion 5. Any method can be used as a welding method for forming fixing portion 5, which may be, for example, tungsten inert gas (TIG) welding.

First portion 3a of element-side terminal 3 includes a projection 3d as shown in FIG. 2. Projection 3d is formed in first terminal 31 that is element-side terminal 3. Second portion 4a of case-side terminal 4 includes a recess 4d that comes into contact with projection 3d of element-side terminal 3 as shown in FIGS. 3 and 5. Specifically, recess 4d is formed in a third terminal 41 that is case-side terminal 4.

Projection 3d includes a top surface 3h facing lateral wall 2a, a first end surface 3f continuous with top surface 3h, and a second end surface 3g continuous with top surface 3h. In first portion 3a (see FIG. 1) of first terminal 31, projection 3d is disposed on the upper end side. The upper side of projection 3d forms the distal end of first terminal 31. The distal end of first terminal 31 has a so-called crown shape in which projections are formed at opposite ends.

First end surface 3f of projection 3d extends to obliquely intersect the width direction of first terminal 31 as viewed from the lateral wall 2a side as shown in FIG. 4. Similarly, second end surface 3g of projection 3d extends to obliquely intersect the width direction of first terminal 31. The direction of extension of first end surface 3f and the direction of extension of second end surface 3g are opposite in the direction of inclination. That is to say, the direction of extension of first end surface 3f intersects the direction of extension of second end surface 3g, and first end surface 3f and second end surface 3g are disposed in a V shape as viewed from the lateral wall 2a side. A connecting portion between first end surface 3f and second end surface 3g is located approximately at the center of first terminal 31 in its width direction. The connecting portion between first end surface 3f and second end surface 3g is a region farthest from the upper end of first terminal 31 in first end surface 3f and second end surface 3g. A lower recess 3e is disposed to be continuous with first end surface 3f and second end surface 3g. The thickness of first terminal 31 in lower recess 3e is smaller than the thickness of first terminal 31 in projection 3d.

Recess 4d in third terminal 41 includes a bottom surface 4h, a first lateral surface 4f, and a second lateral surface 4g. Bottom surface 4h faces top surface 3h of projection 3d. First lateral surface 4f is continuous with bottom surface 4h and comes into contact with first end surface 3f of projection 3d. Second lateral surface 4g is continuous with bottom surface 4h and comes into contact with second end surface 3g of projection 3d. The direction of extension of first lateral surface 4f and the direction of extension of second lateral surface 4g are opposite in the direction of inclination. That is to say, the direction of extension of first end surface 4f intersects the direction of extension of second end surface 4g, and first lateral surface 4f and second lateral surface 4g are disposed in a V shape as viewed from the lateral wall 2a side. A lower projection 4e is disposed to be continuous with first lateral surface 4f and second lateral surface 4g. The thickness of third terminal 41 in lower projection 4e is greater than the thickness of third terminal 41 in recess 4d.

<Method of Manufacturing Semiconductor Device>

Figure 6:
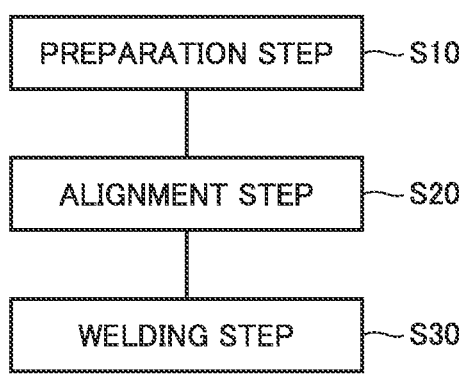
FIG. 6 is a flowchart for illustrating a method of manufacturing the semiconductor device according to Embodiment 1.

FIG. 6 is a flowchart for illustrating a method of manufacturing the semiconductor device according to Embodiment 1. The method of manufacturing the semiconductor device shown in FIGS. 1 to 5 will be described with reference to FIG. 6.

In the method of manufacturing the semiconductor device shown in FIGS. 1 to 5, first, a preparation step (S10) is performed. In this step (S10), semiconductor element 1 having element-side terminal 3 and case 2 having lateral wall 2a are prepared. Case 2 is connected with case-side terminal 4 as described above. Element-side terminal 3 includes first portion 3a to come into contact with case-side terminal 4 in first terminal 31. Projection 3d is formed in first portion 3a. Case-side terminal 4 includes second portion 4a that faces lateral wall 2a and extends along lateral wall 2a in third terminal 41. Recess 4d to come into contact with projection 3d is formed in second portion 4a.

Subsequently, an alignment step (S20) is performed. In this step (S20), semiconductor element 1 is disposed in case 2 with projection 3d being in contact with recess 4d. Specifically, first, case 2 is fixed on a fixed base or the like. Subsequently, semiconductor element 1 is lifted by a transfer arm of a transfer device. Provided at the distal end of the transfer arm is, for example, a suction member such as a vacuum suction device or an electrostatic suction device. This suction member sucks and holds semiconductor element 1.

In this state, image recognition is performed from the lower surface of semiconductor element 1, thereby checking a misalignment when the suction member sucks semiconductor element 1. Subsequently, an amount of the misalignment is corrected, and the transfer arm is moved, thereby inserting semiconductor element 1 into case 2 through the upper opening of lateral wall 2a of case 2. At this time, element-side terminal 3 can be accurately aligned with case-side terminal 4 by fitting projection 3d of element-side terminal 3 into recess 4d of case-side terminal 4. Element-side terminal 3 can be aligned simultaneously with the insertion of semiconductor element 1 into case 2, leading to improved productivity of a process of manufacturing a semiconductor device.

At this time, first portion 3a of element-side terminal 3 is configured to be inclined to the lateral surface of semiconductor element 1 such that the distance between the distal end, which is the upper end, and the lateral surface of semiconductor element 1 is greater than the distance between the base portion, which is the lower end of first portion 3a, and the lateral surface of semiconductor element 1. This allows projection 3d of element-side terminal 3 to reliably come into contact with recess 4d of case-side terminal 4. First end surface 3f and second end surface 3g of projection 3d come into contact with first lateral surface 4f and second lateral surface 4g of recess 4d, respectively, thereby accurately determining the position of element-side terminal 3 relative to case-side terminal 4.

Subsequently, a welding step (S30) is performed. In this step (S30), first portion 3a and second portion 4a are fixed by, for example, welding with projection 3d being in contact with recess 4d. At this time, element-side terminal 3 is accurately aligned with case-side terminal 4 as described above, thereby reliably fixing case-side terminal 4 and element-side terminal 3 by welding.

<Function and Effect>

Semiconductor device 50 according to the present disclosure includes semiconductor element 1, case 2, and case-side terminal 4. Semiconductor element 1 has element-side terminal 3. Case 2 holds semiconductor element 1 therein and has lateral wall 2a. Case-side terminal 4 is connected to case 2. Element-side terminal 3 and case-side terminal 4 are located in the region between lateral wall 2a and semiconductor element 1 and are connected to each other. First portion 3a of element-side terminal 3 which comes into contact with case-side terminal 4 extends along lateral wall 2a. First portion 3a includes projection 3d. Second portion 4a of case-side terminal 4 which comes into contact with element-side terminal 3 extends along lateral wall 2a. Second portion 4a includes recess 4d that contacts projection 3d. Projection 3d includes top surface 3h facing lateral wall 2a, first end surface 3f continuous with top surface 3h, and second end surface 3g continuous with top surface 3h. Recess 4d includes bottom surface 4h facing top surface 3h of projection 3d, first lateral surface 4f which is continuous with bottom surface 4h and is in contact with first end surface 3f of projection 3d, and second lateral surface 4g which is continuous with bottom surface 4h and is in contact with second end surface 3g of projection 3d. As viewed from the lateral wall 2a side, first end surface 3f and first lateral surface 4f extend to be inclined in the first direction, and second end surface 3g and second lateral surface 4g extend to be inclined in the second direction opposite to the first direction. In other words, second end surface 3g and second lateral surface 4g extend to be inclined in the second direction intersecting the first direction.

With this configuration, first end surface 3f and second end surface 3g of projection 3d come into contact with first lateral surface 4f and second lateral surface 4g of recess 4d, respectively, by fitting projection 3d of first portion 3a of element-side terminal 3 into recess 4d of second portion 4a of case-side terminal 4. This allows projection 3d to be accurately aligned with recess 4d. Consequently, as viewed from the lateral wall 2a side, the position of element-side terminal 3 with respect to case-side terminal 4 in a left-right direction and the position thereof in a vertical direction perpendicular to the left-right direction can be determined accurately. The position of element-side terminal 3 can thus be determined such that element-side terminal 3 is reliably in contact with case-side terminal 4, thus more reliably connecting case-side terminal 4 and element-side terminal 3 to each other by welding or the like. As a result, semiconductor device 50 with high reliability can be achieved in which the occurrence of a misalignment between case-side terminal 4 and element-side terminal 3 is reduced.

Figure 7:
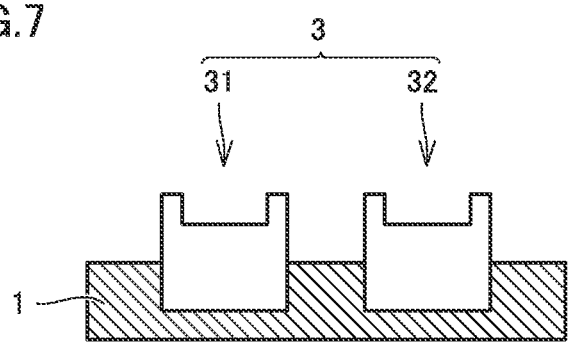
FIG. 7 is a schematic view of an element-side terminal in a semiconductor device as a reference example.
Figure 8:
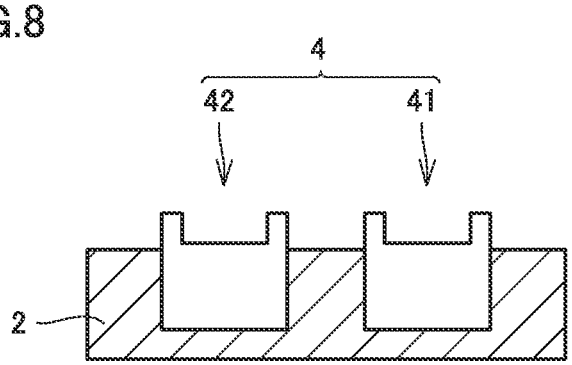
FIG. 8 is a schematic view of a case-side terminal in the semiconductor device as the reference example.
Figure 9:
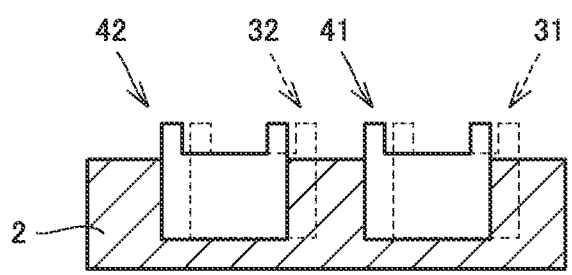
FIG. 9 is a schematic view of the case-side terminal and the element-side terminal horizontally misaligned with each other.
Figure 10:
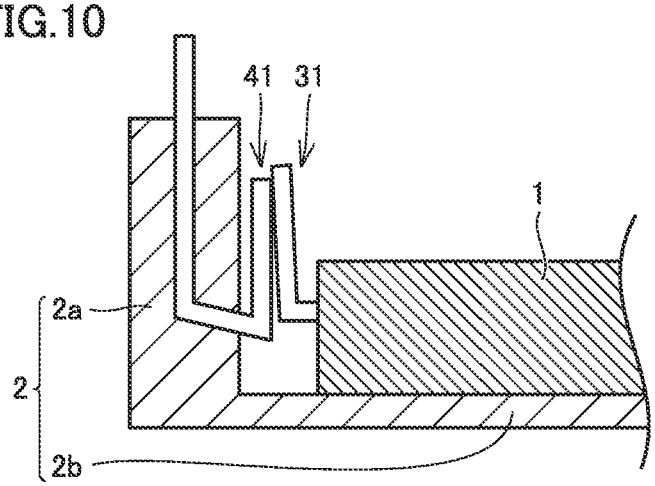
FIG. 10 is a partial schematic sectional view of the case-side terminal and the element-side terminal vertically misaligned with each other.
Figure 11:
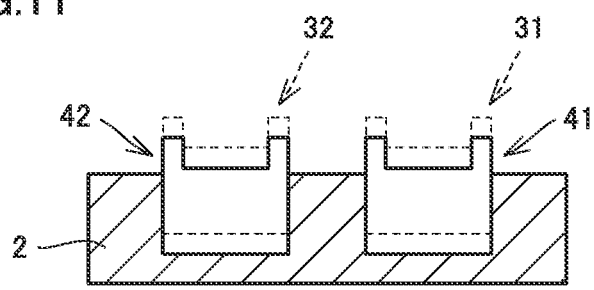
FIG. 11 is a schematic view of the case-side terminal and the element-side terminal vertically misaligned with each other.

Now, description will be given in comparison with a semiconductor device as a reference example to further clarify the effects of semiconductor device 50 according to the present embodiment. FIG. 7 is a schematic view of an element-side terminal in the semiconductor device as the reference example. FIG. 8 is a schematic view of a case-side terminal in the semiconductor device as the reference example. FIGS. 7 and 8 correspond to FIGS. 2 and 3, respectively. FIG. 9 is a schematic view of the case-side terminal and the element-side terminal horizontally misaligned with each other. FIG. 10 is a partial schematic sectional view of the case-side terminal and the element-side terminal vertically misaligned with each other. FIG. 11 is a schematic view of the case-side terminal and the element-side terminal vertically misaligned with each other.

The semiconductor device as the reference example shown in FIGS. 7 and 8 does not have a projection formed in element-side terminal 3 or a recess formed in case-side terminal 4. Thus, when semiconductor element 1 is disposed in case 2 as in the method of manufacturing the semiconductor device shown in FIG. 6, first terminal 31 and second terminal 32 that are element-side terminals 3 may be misaligned with third terminal 41 and a fourth terminal 42 that are case-side terminals 4, as shown in FIG. 9 or 10 and 11. In this case, it is difficult to connect element-side terminal 3 and case-side terminal 4 to each other by welding in the welding step (S30) shown in FIG. 6.

In contrast, in the semiconductor device according to the present embodiment, projection 3d and recess 4d are formed in element-side terminal 3 and case-side terminal 4, respectively, and semiconductor element 1 is aligned such that projection 3d is fitted into recess 4d. Further, since the contact interface between projection 3d and recess 4d includes two inclined surfaces that are inclined in the opposite directions (i.e., the contact interface between projection 3d and recess 4d includes two inclined surfaces that are inclined to intersect each other), element-side terminal 3 moves along the contact interface when element-side terminal 3 is brought into contact with case-side terminal 4, thereby more reliably aligning element-side terminal 3 having projection 3d with case-side terminal 4 having recess 4d.

In semiconductor device 50, as viewed from the lateral wall 2a side, first end surface 3f and second end surface 3g of projection 3d are disposed in a V shape, and first lateral surface 4f and second lateral surface 4g of recess 4d are disposed in a V shape, as shown in FIGS. 2 to 4. In this case, by fitting projection 3d into recess 4d, case-side terminal 4 and element-side terminal 3 are aligned with each other such that the position of the connecting portion between first lateral surface 4f and second lateral surface 4g which have V shape overlaps the position of the connecting portion between first end surface 3f and second end surface 3g of projection 3d. Thus, by setting the connecting portions to be located at the center of case-side terminal 4 and at the center of element-side terminal 3 in their width directions, case-side terminal 4 and element-side terminal 3 can be aligned with each other such that the central portions of case-side terminal 4 and element-side terminal 3 in their width directions overlap each other.

A method of manufacturing a semiconductor device according to the present disclosure includes a preparation step (S10) that is a step of preparing semiconductor element 1 having element-side terminal 3 and case 2 having lateral wall 2a. Case 2 is connected with case-side terminal 4. Element-side terminal 3 includes first portion 3a to come into contact with case-side terminal 4. First portion 3a includes projection 3d. Case-side terminal 4 includes second portion 4a that faces lateral wall 2a and extends along lateral wall 2a. Second portion 4a includes recess 4d to come into contact with projection 3d. Projection 3d includes top surface 3h facing lateral wall 2a, first end surface 3f continuous with top surface 3h, and second end surface 3g continuous with top surface 3h. Recess 4d includes bottom surface 4h facing top surface 3h of projection 3d, first lateral surface 4f which is continuous with bottom surface 4h and is to be in contact with first end surface 3f of projection 3d, and second lateral surface 4g which is continuous with bottom surface 4h and is to be in contact with second end surface 3g of projection 3d. The method of manufacturing a semiconductor device further includes an alignment step (S20) that is a step of disposing semiconductor element 1 in case 2 with projection 3d being in contact with recess 4d. In the alignment step (S20) that is the step of disposing semiconductor element 1, as viewed from the lateral wall 2a side, first end surface 3f and first lateral surface 4f extend to be inclined in a first direction, and second end surface 3g and second lateral surface 4g extend to be inclined in a second direction opposite to the first direction. In other words, second end surface 3g and second lateral surface 4g extend to be inclined in the second direction intersecting the first direction. The method of manufacturing a semiconductor device further includes a welding step (S30) that is a step of fixing first portion 3a and second portion 4a with projection 3d being in contact with recess 4d.

In this case, the projection having first end surface 3f and second end surface 3g is fitted into recess 4d having first lateral surface 4f and second lateral surface 4g that are inclined in opposite directions, thereby accurately aligning element-side terminal 3 with case-side terminal 4. In other words, the projection having first end surface 3f and second end surface 3g is fitted into recess 4d having first lateral surface 4f and second lateral surface 4g that are inclined in intersecting directions, thereby accurately aligning element-side terminal 3 with case-side terminal 4. This can prevent a misalignment between first portion 3a of element-side terminal 3 and second portion 4a of case-side terminal 4, thereby reliably fixing first portion 3a and second portion 4a.

Embodiment 2

Figure 12:
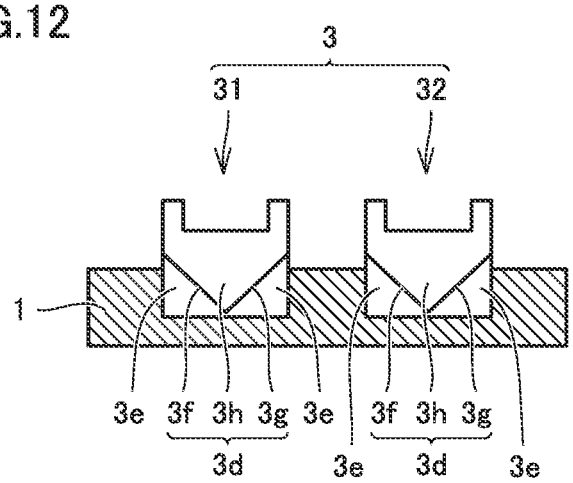
FIG. 12 is a schematic view of an element-side terminal in a semiconductor device according to Embodiment 2.
Figure 13:
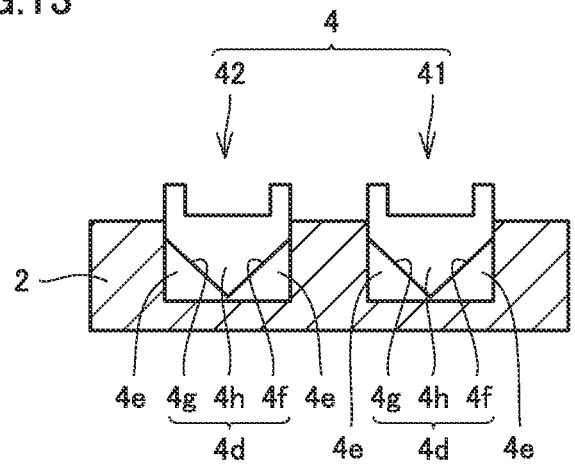
FIG. 13 is a schematic view of a case-side terminal in the semiconductor device according to Embodiment 2.

<Configuration of Semiconductor Device>
FIG. 12 is a schematic view of an element-side terminal in a semiconductor device according to Embodiment 2. FIG. 13 is a schematic view of a case-side terminal in the semiconductor device according to Embodiment 2. FIGS. 12 and 13 correspond to FIGS. 2 and 3, respectively.

Although the semiconductor device shown in FIGS. 12 and 13 basically has a configuration similar to that of the semiconductor device shown in FIGS. 1 to 5, it differs from the semiconductor device shown in FIGS. 1 to 5 in that projection 3d is formed in both of first terminal 31 and second terminal 32 that are element-side terminals 3 and that recess 4d is formed in both of third terminal 41 and fourth terminal 42 that are case-side terminals 4. The configuration of projection 3d formed in second terminal 32 is similar to the configuration of projection 3d formed in first terminal 31. The configuration of recess 4d formed in fourth terminal 42 is similar to the configuration of recess 4d formed in third terminal 41. In the semiconductor device shown in FIGS. 12 and 13, projection 3d of first terminal 31 and recess 4d of third terminal 41 are connoted to each other, and projection 3d of second terminal 32 and recess 4d of fourth terminal 42 are connected to each other. That is to say, a connecting portion between projection 3d and recess 4d, which is used in alignment of element-side terminal 3 and case-side terminal 4, is formed at two locations for one lateral surface of semiconductor element 1.

<Function and Effect>
In semiconductor device 50, element-side terminals 3 include first terminal 31 and second terminal 32. Case-side terminals 4 include third terminal 41 and fourth terminal 42. Projection 3d is formed in first terminal 31 and second terminal 32. Recess 4d is formed in third terminal 41 and fourth terminal 42. Projection 3d of first terminal 31 comes into contact with recess 4d of third terminal 41. Projection 3d of second terminal 32 comes into contact with recess 4d of fourth terminal 42. Projection 3d of first terminal 31 includes first end surface 3f and second end surface 3g. Projection 3d of second terminal 32 includes first end surface 3f and second end surface 3g. Recess 4d of third terminal 41 includes first lateral surface 4f and second lateral surface 4g. Recess 4d of fourth terminal 42 includes first lateral surface 4f and second lateral surface 4g.

In this case, projection 3d is formed in each of first terminal 31 and second terminal 32 that are a plurality of element-side terminals 3, and recess 4d is formed in each of third terminal 41 and fourth terminal 42 that are a plurality of case-side terminals 4, and accordingly, a plurality of connecting portions, each of which is composed of recess 4d and projection 3d, for aligning element-side terminal 3 with case-side terminal 4 can be formed. If there is one connecting portion between recess 4d and projection 3d, a stress may concentrate on the one connecting portion and element-side terminal 3 and case-side terminal 4 constituting the connecting portion may be broken. However, the formation of a plurality of connecting portions as describe above can reduce a probability of occurrence of such breakage.

Embodiment 3

Figure 14:
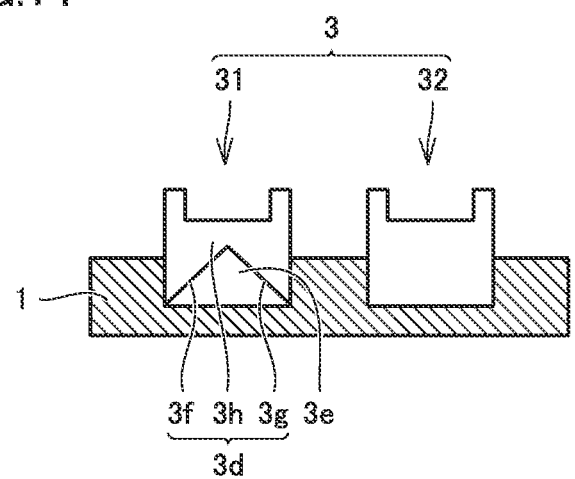
FIG. 14 is a schematic view of an element-side terminal in a semiconductor device according to Embodiment 3.
Figure 15:
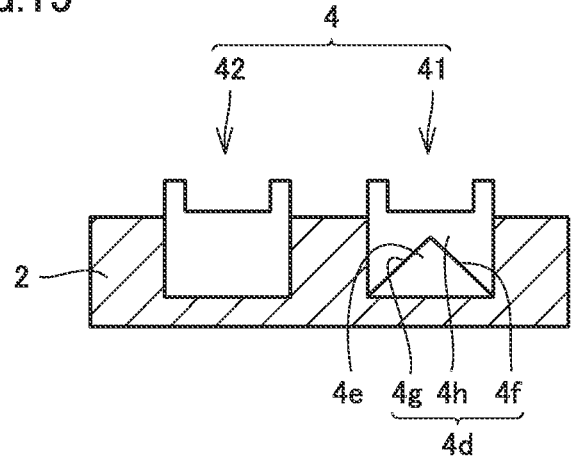
FIG. 15 is a schematic view of a case-side terminal in the semiconductor device according to Embodiment 3.
Figure 16:
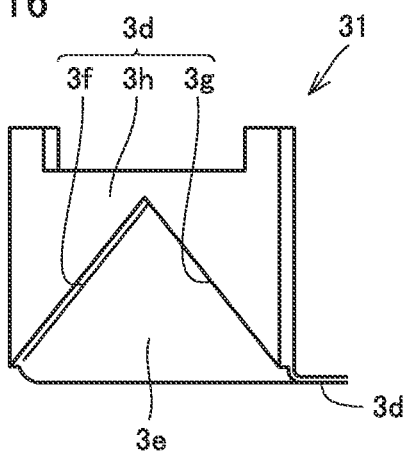
FIG. 16 is an enlarged schematic view of the element-side terminal shown in FIG. 14.
Figure 17:
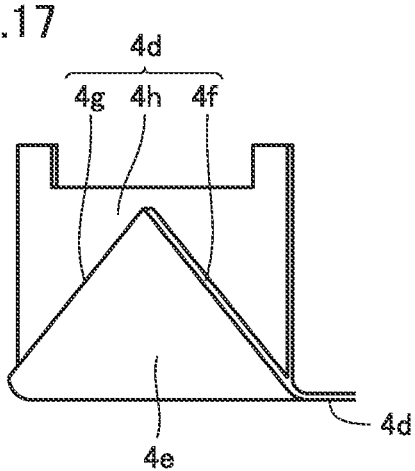
FIG. 17 is an enlarged schematic view of the case-side terminal shown in FIG. 15.

<Configuration of Semiconductor Device>
FIG. 14 is a schematic view of an element-side terminal in a semiconductor device according to Embodiment 3. FIG. 15 is a schematic view of a case-side terminal in the semiconductor device according to Embodiment 3. FIG. 16 is an enlarged schematic view of the element-side terminal shown in FIG. 14. FIG. 17 is an enlarged schematic view of the case-side terminal shown in FIG. 15. FIGS. 14 to 17 correspond to FIGS. 2 to 5, respectively.

Although the semiconductor device shown in FIGS. 14 to 17 basically has a configuration similar to that of the semiconductor device shown in FIGS. 1 to 5, it differs from the semiconductor device shown in FIGS. 1 to 5 in the shape of projection 3d of element-side terminal 3 and the shape of recess 4d of case-side terminal 4.

In first terminal 31 of element-side terminal 3, the direction of extension of first end surface 3f of projection 3d and the direction of extension of second end surface 3g thereof are opposite in the direction of inclination. In other words, the direction of extension of first end surface 3f of projection 3d intersects the direction of extension of second end surface 3g thereof. As viewed from the lateral wall 2a side, first end surface 3f and second end surface 3g are disposed in an inverted V shape. The connecting portion between first end surface 3f and second end surface 3g is located approximately at the center of first terminal 31 in its width direction. The connecting portion between first end surface 3f and second end surface 3g is a region closest to the upper end of first terminal 31 in first end surface 3f and second end surface 3g.

In third terminal 41 of case-side terminal 4, the direction of extension of first lateral surface 4f of recess 4d and the direction of extension of second lateral surface 4g thereof are opposite in the direction of inclination. In other words, the direction of extension of first end surface 4f of projection 4d intersects the direction of extension of second end surface 4g thereof. As viewed from the lateral wall 2a side, first lateral surface 4f and second lateral surface 4g are disposed in an inverted V shape. The connecting portion between first lateral surface 4f and second lateral surface 4g is located approximately at the center of third terminal 41 in its width direction. The connecting portion between first lateral surface 4f and second lateral surface 4g is a region closest to the upper end of third terminal 41 in first lateral surface 4f and second lateral surface 4g.

<Function and Effect>
In semiconductor device 50, as viewed from the lateral wall 2a side, first end surface 3f and second end surface 3g of projection 3d are disposed in an inverted V shape, and first lateral surface 4f and second lateral surface 4g of recess 4d are disposed in an inverted V shape. In this case, by fitting projection 3d into recess 4d, case-side terminal 4 and element-side terminal 3 are aligned with each other such that the position of the connecting portion between first lateral surface 4f and second lateral surface 4g of recess 4d, which have an inverted V shape, overlaps the position of the connecting portion between first end surface 3f and second end surface 3g of projection 3d. Thus, by setting the connecting portion to be located at the center of each of case-side terminal 4 and element-side terminal 3 in their its direction, case-side terminal 4 and element-side terminal 3 can be aligned with each other such that the central portions of case-side terminal 4 and element-side terminal 3 in their width directions overlap each other. Further, semiconductor device 50 has the region connecting projection 3d to recess 4d, which has a shape vertically opposite to that of the semiconductor device shown in FIGS. 1 to 5, thereby further reducing the occurrence of a vertical misalignment of element-side terminal 3 with case-side terminal 4.

Embodiment 4

<Configuration of Semiconductor Device>

Figure 18:
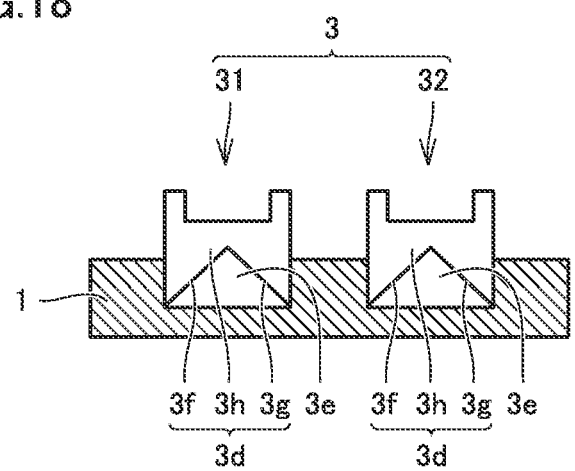
FIG. 18 is a schematic view of an element-side terminal in a semiconductor device according to Embodiment 4.
Figure 19:
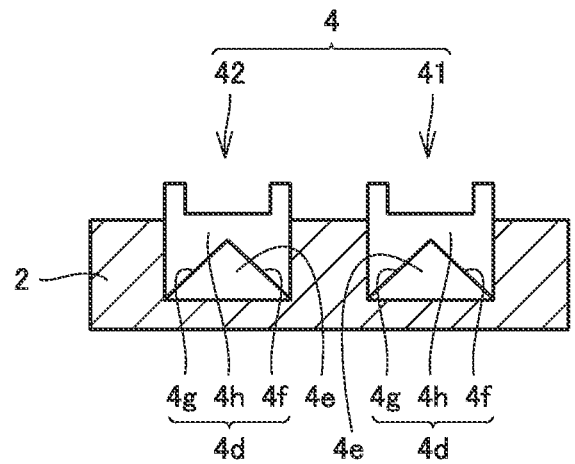
FIG. 19 is a schematic view of a case-side terminal in the semiconductor device according to Embodiment 4.

FIG. 18 is a schematic view of an element-side terminal in a semiconductor device according to Embodiment 4. FIG. 19 is a schematic view of a case-side terminal in the semiconductor device according to Embodiment 4. FIGS. 18 and 19 correspond to FIGS. 14 and 15, respectively.

Although the semiconductor device shown in FIGS. 18 and 19 basically has a configuration similar to that of the semiconductor device shown in FIGS. 14 to 17, it differs from the semiconductor device shown in FIGS. 14 to 17 in that projection 3d is formed in both of first terminal 31 and second terminal 32 that are element-side terminals 3 and that recess 4d is formed in both of third terminal 41 and fourth terminal 42 that are case-side terminals 4. The configuration of projection 3d formed in second terminal 32 is similar to the configuration of projection 3d formed in first terminal 31. The configuration of recess 4d formed in fourth terminal 42 is similar to the configuration of recess 4d formed in third terminal 41. In the semiconductor device shown in FIGS. 18 and 19, projection 3d of first terminal 31 and recess 4d of third terminal 41 are connected to each other, and projection 3d of second terminal 32 and recess 4d of fourth terminal 42 are connected to each other. That is to say, the connecting portion between projection 3d and recess 4d which is used in alignment of element-side terminal 3 and case-side terminal 4 is formed in two locations for one lateral surface of semiconductor element 1.

<Function and Effect>

In this case, effects similar to those of the semiconductor device shown in FIGS. 14 to 17 can be achieved, and also, a connecting portion between projection 3d and recess 4d for alignment of element-side terminal 3 and case-side terminal 4 can be provided in a plurality of locations, as in the case of the semiconductor device shown in FIGS. 12 and 13. Thus, a possibility that a stress may concentrate on one connecting portion and element-side terminal 3 and case-side terminal 4 constituting the connecting portion may be broken, which occurs in the case in which there is one such connecting portion between recess 4d and projection 3d, can be reduced.

Embodiment 5

<Configuration of Semiconductor Device>

Figure 20:
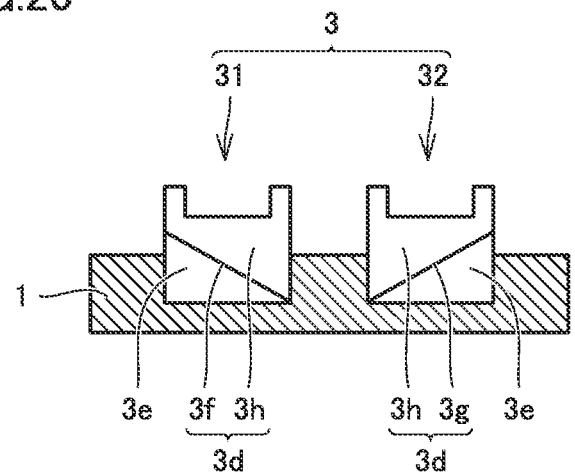
FIG. 20 is a schematic view of an element-side terminal in a semiconductor device according to Embodiment 5.
Figure 21:
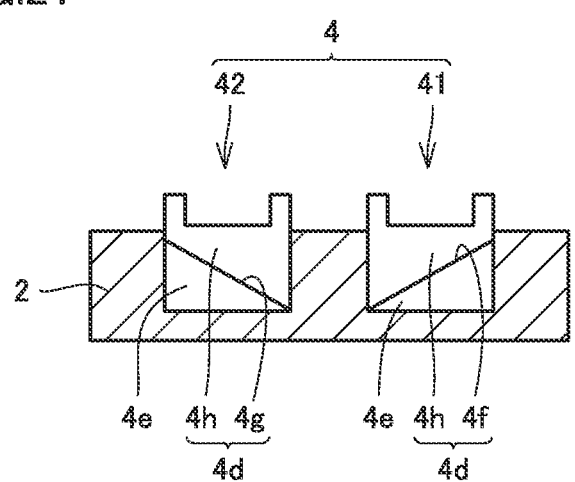
FIG. 21 is a schematic view of a case-side terminal in the semiconductor device according to Embodiment 5.
Figure 22:
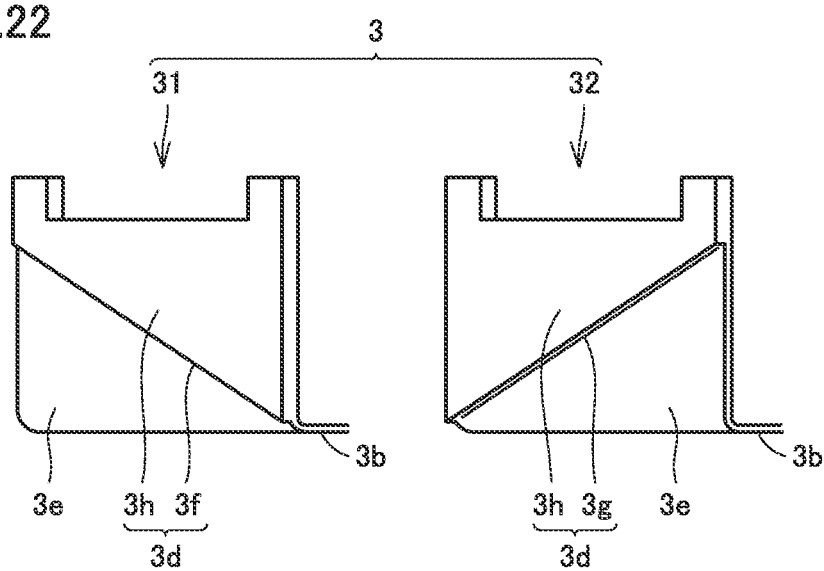
FIG. 22 is an enlarged schematic view of the element-side terminal shown in FIG. 20.
Figure 23:
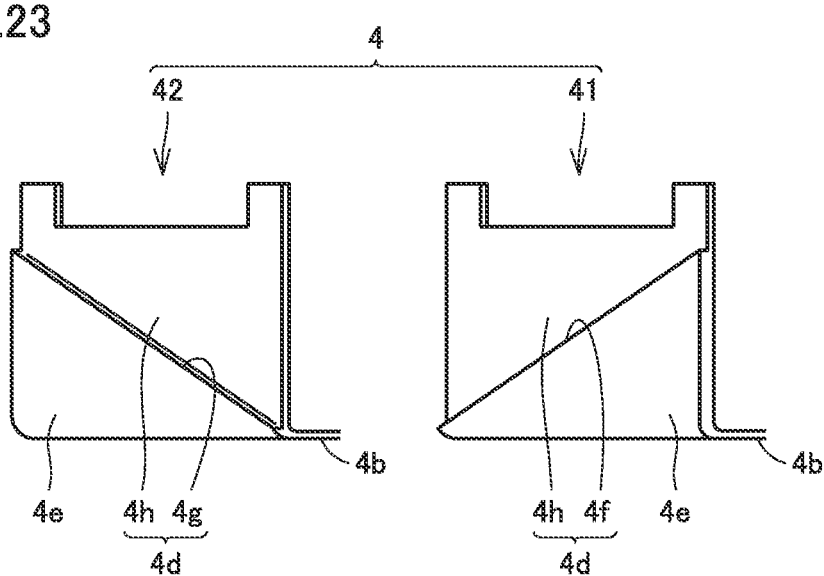
FIG. 23 is an enlarged schematic view of the case-side terminal shown in FIG. 21.

FIG. 20 is a schematic view of an element-side terminal in a semiconductor device according to Embodiment 5. FIG. 21 is a schematic view of a case-side terminal in the semiconductor device according to Embodiment 5. FIG. 22 is an enlarged schematic view of the element-side terminal shown in FIG. 20. FIG. 23 is an enlarged schematic view of the case-side terminal shown in FIG. 21. FIGS. 20 to 23 correspond to FIGS. 2 to 5, respectively.

Although the semiconductor device shown in FIGS. 20 to 23 basically has a configuration similar to that of the semiconductor device shown in FIGS. 12 and 13, it differs from the semiconductor device shown in FIGS. 12 and 13 in the shape of projection 3d of element-side terminal 3 and the shape of recess 4d of case-side terminal 4. That is to say, in first terminal 31 of element-side terminal 3, first end surface 3f alone is formed on the vertically lower side of projection 3d. First end surface 3f obliquely extends such that the second terminal 32 side thereof is directed vertically downward as viewed from the lateral wall 2a (see FIG. 1) side of case 2. In second terminal 32 of element-side terminal 3, second end surface 3g alone is formed on the vertically lower side of projection 3d. Second end surface 3g extends obliquely such that the first terminal 31 side thereof is directed vertically downward as viewed from the lateral wall 2a (see FIG. 1) side of case 2.

In third terminal 41 of case-side terminal 4, first lateral surface 4f alone is formed on the vertically lower side of recess 4d. First lateral surface 4f extends obliquely, such that the fourth terminal 42 side thereof is directed vertically downward as viewed from the lateral wall 2a (see FIG. 1) side of case 2. In fourth terminal 42 of case-side terminal 4, second lateral surface 4g alone is formed on the vertically lower side of recess 4d. Second lateral surface 4g extends obliquely such that the third terminal 41 side thereof is directed vertically downward as viewed from the lateral wall 2a (see FIG. 1) side of case 2.

<Function and Effect>

In semiconductor device 50, element-side terminals 3 include first terminal 31 and second terminal 32. Case-side terminals 4 include third terminal 41 and fourth terminal 42. Projection 3d is formed in first terminal 31 and second terminal 32. Recess 4d is formed in third terminal 41 and fourth terminal 42. Projection 3d of first terminal 31 comes into contact with recess 4d of third terminal 41. Projection 3d of second terminal 32 comes into contact with recess 4d of fourth terminal 42. Projection 3d of first terminal 31 includes first end surface 3f. Projection 3d of second terminal 32 includes second end surface 3g. Recess 4d of third terminal 41 includes first lateral surface 4f. Recess 4d of fourth terminal 42 includes second lateral surface 4g.

In this case, a connecting portion between projection 3d and recess 4d for alignment of element-side terminal 3 and case-side terminal 4 can be formed in a plurality of locations as in the semiconductor device shown in FIGS. 12 and 13. Thus, a possibility that a stress may concentrate on one connecting portion and element-side terminal 3 and case-side terminal 4 constituting the connecting portion may be broken, which occurs in the case in which there is one such connecting portion between recess 4d and projection 3d, can be reduced.

Further, the widths of first end surface 3f and second end surface 3g of projection 3d in the present embodiment are substantially identical to the width of element-side terminal 3 and are greater than the widths of first end surface 3f and second end surface 3g shown in FIG. 2. Also, the widths of first lateral surface 4f and second lateral surface 4g of recess 4d in the present embodiment are greater than the widths of first lateral surface 4f and second lateral surface 4g shown in FIG. 3. Thus, the semiconductor device of the present embodiment can adjust the position of element-side terminal 3 with respect to case-side terminal 4 in its width direction in a wide range compared with the semiconductor device shown in FIGS. 2 and 3.

Embodiment 6

<Configuration of Semiconductor Device>

Figure 24:
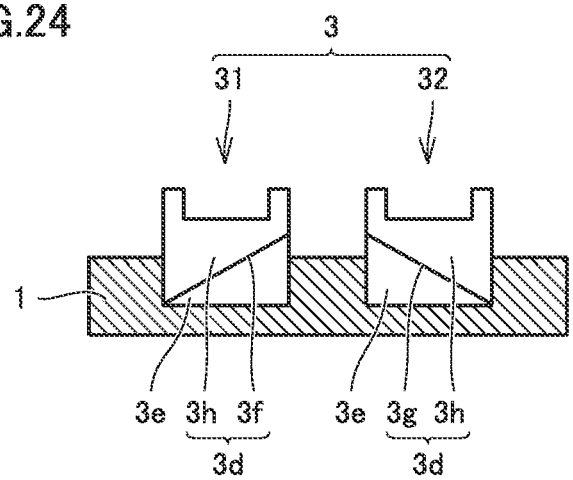
FIG. 24 is a schematic view of an element-side terminal in a semiconductor device according to Embodiment 6.

FIG. 24 is a schematic view of an element-side terminal in a semiconductor device according to Embodiment 6. FIG.

Figure 26:
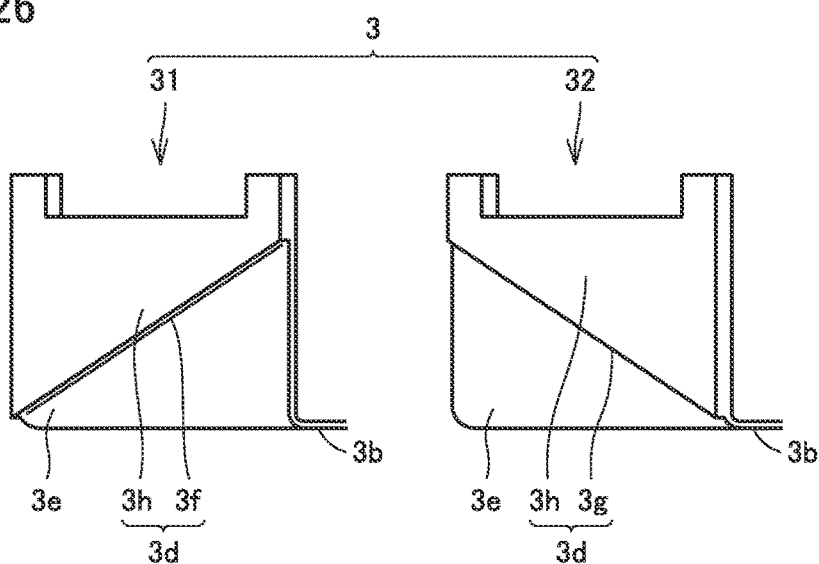
FIG. 26 is an enlarged schematic view of the element-side terminal shown in FIG. 24.
Figure 27:
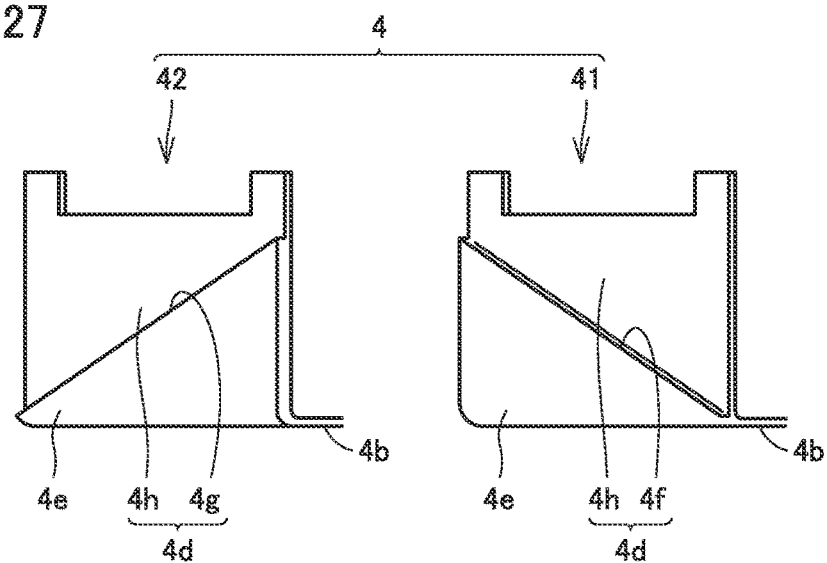
FIG. 27 is an enlarged schematic view of the case-side terminal shown in FIG. 25.

25 is a schematic view of a case-side terminal in the semiconductor device according to Embodiment 6. FIG. 26 is an enlarged schematic view of the element-side terminal shown in FIG. 24. FIG. 27 is an enlarged schematic view of the case-side terminal shown in FIG. 25. FIGS. 24 to 27 correspond to FIGS. 20 to 23, respectively.

Although the semiconductor device shown in FIGS. 24 to 27 basically has a configuration similar to that of the semiconductor device shown in FIGS. 20 to 23, it differs from the semiconductor device shown in FIGS. 20 to 23 in the shape of projection 3d of element-side terminal 3 and the shape of recess 4d of case-side terminal 4. That is to say, in first terminal 31 of element-side terminal 3, first end surface 3f alone is formed on the vertically lower side of projection 3d, and the direction of inclination of first end surface 3f is opposite to the direction of inclination of first end surface 3f of the semiconductor device shown in FIG. 22. That is to say, as shown in FIG. 24, first end surface 3f extends obliquely such that the second terminal 32 side thereof is directed vertically upward as viewed from the lateral wall 2a (see FIG. 1) side of case 2. In second terminal 32 of element-side terminal 3, second end surface 3g alone is formed on the vertically lower side of projection 3d. Second end surface 3g extends obliquely such that the first terminal 31 side thereof is directed vertically upward as viewed from the lateral wall 2a (see FIG. 1) side of case 2.

Figure 25:
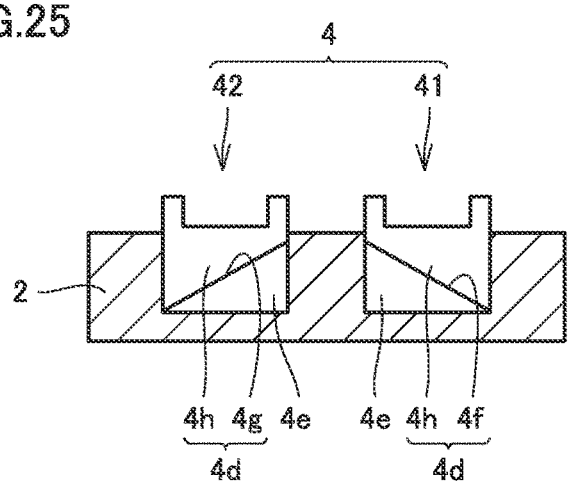
FIG. 25 is a schematic view of a case-side terminal in the semiconductor device according to Embodiment 6.

As shown in FIG. 25, in third terminal 41 of case-side terminal 4, first lateral surface 4f alone is formed on the vertically lower side of recess 4d. First lateral surface 4f extends obliquely such that the fourth terminal 42 side thereof is directed vertically upward as viewed from the lateral wall 2a (see FIG. 1) side of case 2. In fourth terminal 42 of case-side terminal 41, second lateral surface 4g alone is formed on the vertically lower side of recess 4d. Second lateral surface 4g extends obliquely such that the third terminal 41 side thereof is directed vertically upward as viewed from the lateral wall 2a (see FIG. 1) side of case 2. As described above, in the semiconductor device shown in FIGS. 24 to 27, the inclinations as to the direction of extension of first end surface 3f and second end surface 3g of projection 3d and first lateral surface 4f and second lateral surface 4g of recess 4d are opposite to those of the semiconductor device shown in FIGS. 20 to 23.

<Function and Effect>

The above configuration can achieve effects basically similar to those of the semiconductor device shown in FIGS. 20 to 23.

Embodiment 7

<Configuration of Semiconductor Device>

Figure 28:
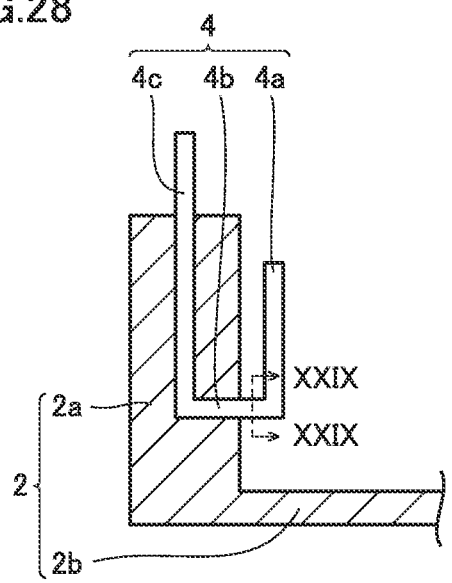
FIG. 28 is a schematic sectional view of a case-side terminal in a semiconductor device according to Embodiment 7.
Figure 29:
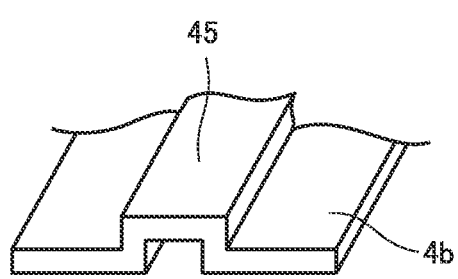
FIG. 29 is a schematic sectional view of the case-side terminal shown in FIG. 28.

FIG. 28 is a schematic sectional view of a case-side terminal in a semiconductor device according to Embodiment 7. FIG. 29 is a schematic sectional view of the case-side terminal shown in FIG. 28. FIG. 28 shows only part of case 2 in the semiconductor device. FIG. 29 is a schematic perspective view including a cross section taken along a line segment XXIX-XXIX in FIG. 28.

Although the semiconductor device shown in FIGS. 28 and 29 basically has a configuration similar to that of the semiconductor device shown in FIGS. 1 to 5, it differs from the semiconductor device shown in FIGS. 1 to 5 in the configuration of case-side terminal 4. That is to say, in the semiconductor device shown in FIGS. 28 and 29, a bent portion 45 is formed in connecting portion 4b of case-side terminal 4. Bent portion 45 is formed by bending connecting portion 4b at a bending line extending in the direction of extension of connecting portion 4b. As shown in FIG. 29, bent portion 45 has a rectangular shape in a cross section in the width direction of connecting portion 4b. Bent portion 45 may have any other appropriate shape. The configuration of connecting portion 4b may be applied to the semiconductor device according to each of the embodiments described above.

<Function and Effect>

In the semiconductor device, case-side terminal 4 includes connecting portion 4b which is continuous with second portion 4a and is connected to case 2. Connecting portion 4b includes bent portion 45 in the cross section extending along the surface of the region of case 2 which is connected with connecting portion 4b.

In this case, the rigidity of connecting portion 4b of case-side terminal 4 can be improved. Consequently, in particular, a vertical displacement of case-side terminal 4 can be reduced, thus improving the accuracy of vertical alignment of element-side terminal 3 and case-side terminal 4.

Embodiment 8

<Configuration of Semiconductor Device>

Figure 30:
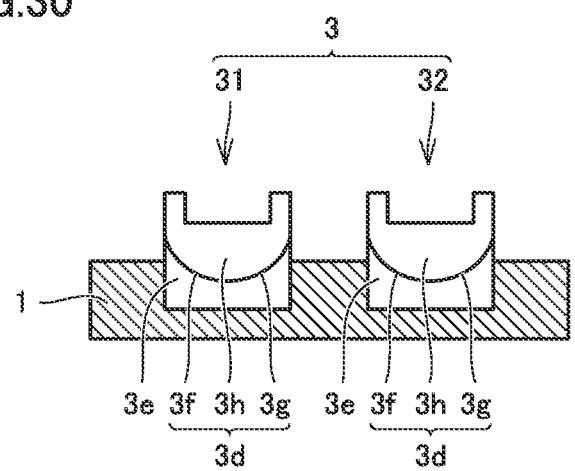
FIG. 30 is a schematic view of an element-side terminal in a semiconductor device according to Embodiment 8.
Figure 31:
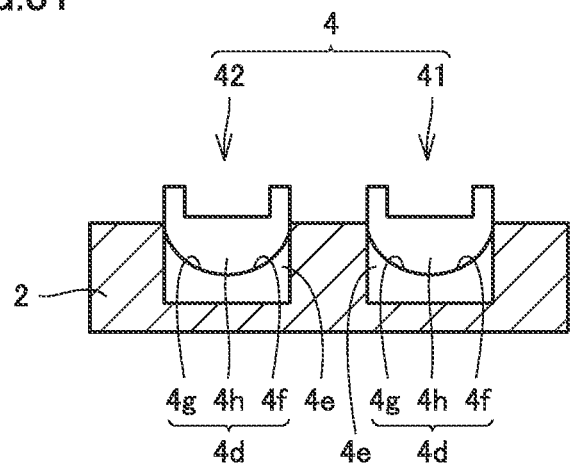
FIG. 31 is a schematic view of a case-side terminal in the semiconductor device according to Embodiment 8.

FIG. 30 is a schematic view of an element-side terminal in a semiconductor device according to Embodiment 8. FIG. 31 is a schematic view of a case-side terminal in the semiconductor device according to Embodiment 8. FIGS. 30 and 31 correspond to FIGS. 12 and 13, respectively.

Although the semiconductor device shown in FIGS. 30 and 31 basically has a configuration similar to that of the semiconductor device shown in FIGS. 12 and 13, it differs from the semiconductor device shown in FIGS. 12 and 13 in the shape of projection 3d of element-side terminal 3 and the shape of recess 4d of case-side terminal 4. That it to say, in the semiconductor device shown in FIGS. 30 and 31, in first terminal 31 and second terminal 32 of element-side terminal 3, first end surface 3f and second end surface 3g of projection 3d extend in a curve shape as viewed from the lateral wall 2a (see FIG. 1) side of case 2. First end surface 3f and second end surface 3g are formed to extend in a downwardly projecting arc shape. First end surface 3f and second end surface 3g may be formed to extend in an upwardly projecting curve shape. As viewed from the lateral wall 2a side, first end surface 3f and second end surface 3g are disposed in a downwardly projecting arc shape. The connecting portion between first end surface 3f and second end surface 3g is located approximately at the center of first terminal 31 in its width direction. The connecting portion between first end surface 3f and second end surface 3g is a region farthest from the upper end of first terminal 31 or second terminal 32 in first end surface 3f and second end surface 3g.

In third terminal 41 and fourth terminal 42 of case-side terminal 4, the direction of extension of first lateral surface 4f of recess 4d and the direction of extension of second lateral surface 4g thereof are opposite in the direction of inclination. In other words, the direction of extension of first lateral surface 4f of recess 4d intersects the direction of extension of second lateral surface 4g thereof. As viewed from the lateral wall 2a side, first lateral surface 4f and second lateral surface 4g are disposed in a downwardly projecting curve shape. As viewed from the lateral wall 2a side, first lateral surface 4f and second lateral surface 4g are formed to extend in a downwardly projecting arc shape. First lateral surface 4f and second lateral surface 4g may be formed to extend in an upwardly projecting curve shape. The connecting portion between first lateral surface 4f and second lateral surface 4g is located approximately at the center of third terminal 41 in its width direction. The connecting portion between first lateral surface 4f and second lateral surface 4g is a region closest to the upper end of third terminal 41 or fourth terminal 42 in first lateral surface 4f and second lateral surface 4g. The configuration in which first end surface 3f and second end surface 3g of projection 3d and first lateral surface 4f and second lateral surface 4g of recess 4d are formed in a curve shape may be applied to each of the above embodiments.

<Function and Effect>

Also when first end surface 3f and second end surface 3g of projection 3d and first lateral surface 4f and second lateral surface 4g of recess 4d are each formed in a curve shape as viewed from the lateral wall 2a side, effects similar to those of the semiconductor device shown in FIGS. 12 and 13 can be achieved.

Embodiment 9

In the present embodiment, the semiconductor device according to any one of Embodiment 1 to Embodiment 8 described above is applied to a power converter. Although the present invention is not limited to a specific power converter, a case in which the present invention is applied to a three-phase inverter will be described below as Embodiment 9.

Figure 32:
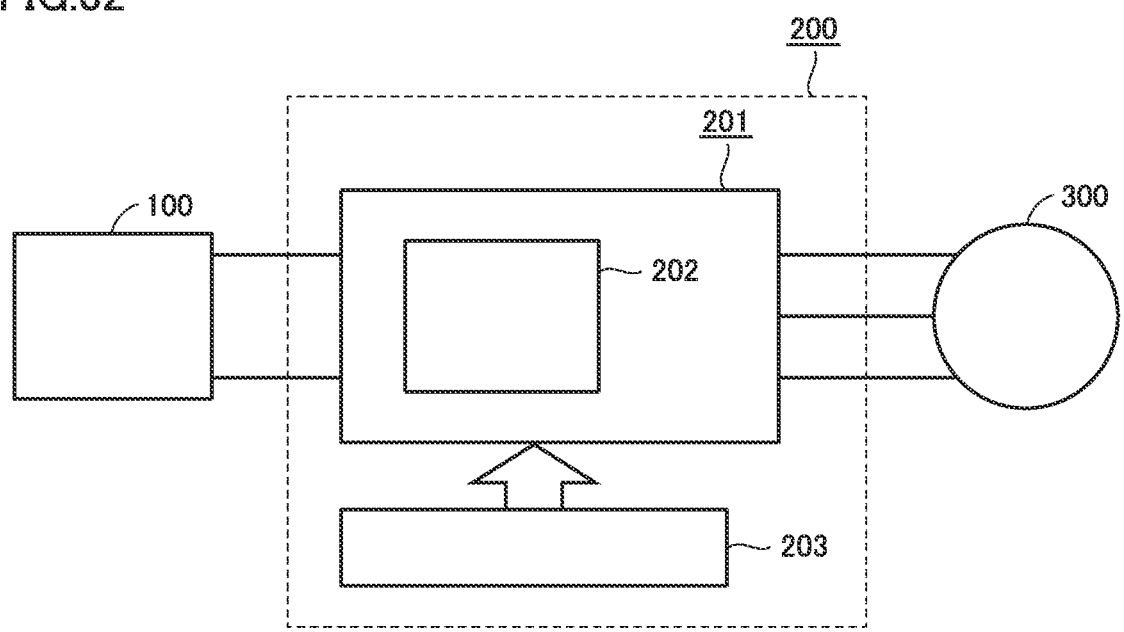
FIG. 32 is a block diagram showing a configuration of a power conversion system according to Embodiment 9.

FIG. 32 is a block diagram showing a configuration of a power conversion system to which the power converter according to the present embodiment is applied.

The power conversion system shown in FIG. 32 includes a power supply 100, a power converter 200, and a load 300. Power supply 100 is a dc power supply and supplies dc power to power converter 200. Power supply 100 can be formed of various components and, for example, may be formed of a dc system, a solar battery, or a storage battery, or may be formed of a rectifier circuit or an AC/DC converter connected to an ac system. Alternatively, power supply 100 may be formed of a DC/DC converter that converts dc power output from the dc system to predetermined power.

Power converter 200 is a three-phase inverter connected between power supply 100 and load 300, and converts dc power supplied from power supply 100 to ac power and supplies the ac power to load 300. Power converter 200 includes a main conversion circuit 201 that converts dc power to ac power and outputs the ac power, and a control circuit 203 that outputs a control signal for controlling main conversion circuit 201 to main conversion circuit 201, as shown in FIG. 32.

Load 300 is a three-phase electric motor driven by the ac power supplied from power converter 200. The application purpose of load 300 is not particularly limited, and load 300 is an electric motor mounted in various electrical devices, which is used as, for example, an electric motor for a hybrid vehicle, an electric vehicle, a railway vehicle, an elevator, or an air-conditioning device.

Power converter 200 will now be described in detail. Main conversion circuit 201 includes a switching element and a reflux diode (which are not shown), and converts the dc power supplied from power supply 100 to ac power and supplies the ac power to load 300 by switching of the switching element. A specific circuit configuration of main conversion circuit 201 comes in various types, and main conversion circuit 201 according to the present embodiment is a two-level three-phase full-bridge circuit and is formed of six switching elements and six reflux diodes, each of which is connected in anti-parallel with a corresponding one of the six switching elements. At least any one of the switching elements and the reflux diodes of main conversion circuit 201 is formed of semiconductor module 202 corresponding to the semiconductor device of any one of Embodiments 1 to 8 described above. The six switching elements are connected in series for every two switching elements and constitute upper and lower arms, and each upper arm and its corresponding lower arm constitute a corresponding one phase (U-phase, V-phase, W-phase) of the full-bridge circuit. The output terminals of the upper and lower arms, namely, three output terminals of main conversion circuit 201 are connected to load 300.

Although main conversion circuit 201 includes a drive circuit (not shown) that drives each switching element, the drive circuit may be built in semiconductor module 202. Alternatively, main conversion circuit 201 may include a drive circuit separately from semiconductor module 202. The drive circuit generates a driving signal for driving a switching element of main conversion circuit 201 and supplies the driving signal to a control electrode of the switching element of main conversion circuit 201. Specifically, the drive circuit outputs a driving signal for turning on the switching element and a driving signal for turning off the switching element to the control electrode of each switching element in accordance with a control signal from control circuit 203 described below. The driving signal is a voltage signal (on signal) equal to or higher than a threshold voltage of the switching element when the switching element is kept in the on state, and the driving signal is a voltage signal (off signal) equal to or lower than the threshold voltage of the switching element when the switching element is kept in the off state.

Control circuit 203 controls the switching elements of main conversion circuit 201 such that desired power is supplied to load 300. Specifically, a time (on time) at which each switching element of main conversion circuit 201 is to be turned on is calculated based on the power to be supplied to load 300. For example, main conversion circuit 201 can be controlled by PWM control that modulates the on time of the switching element in accordance with a voltage to be output. Control circuit 203 then outputs a control command (control signal) to the drive circuit of main conversion circuit 201 such that an on signal is output to the switching element to be turned on at each point in time and an off signal is output to the switching element to be turned off at each point in time. The drive circuit outputs an on signal or off signal as a driving signal to the control electrode of each switching element in accordance with this control signal.

The power converter according to the present embodiment, to which the semiconductor device according to any one of Embodiments 1 to 8 is applied as the switching element and the reflux diode of main conversion circuit 201, can achieve a power converter with high reliability.

Although the present embodiment has described the example in which the present invention is applied to a two-level three-phase inverter, the present invention is not limited thereto and is applicable to various power converters. Although the present invention is applied to a two-level power converter in the present embodiment, it is applicable to a three-level or multi-level power converter, or a single-phase inverter when power is supplied to a single-phase load. Alternatively, when power is supplied to a dc load or the like, the present invention is applicable to a DC/DC converter or an AC/DC converter.

The power converter to which the present invention is applied is not limited to the case in which the load described above is an electric motor, and can be used as, for example, a power supply device of an electric discharge machine, a laser beam machine, an induction heating cooking device, or a contactless feed system, and further can be used as a power conditioner of a photovoltaic power generating system, a power storage system, or the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor element having an element-side terminal;
   a case holding the semiconductor element therein and having a lateral wall; and
   a case-side terminal connected to the case, wherein
   the element-side terminal and the case-side terminal are located in a region between the lateral wall and the semiconductor element and are connected to each other,
   a first portion of the element-side terminal which comes into contact with the case-side terminal extends along the lateral wall and includes a projection,
   a second portion of the case-side terminal which comes into contact with the element-side terminal extends along the lateral wall and includes a recess which comes into contact with the projection,
   the projection includes
     a top surface facing the lateral wall,
     a first end surface continuous with the top surface, and
     a second end surface continuous with the top surface,
   the recess includes
     a bottom surface facing the top surface of the projection,
     a first lateral surface which is continuous with the bottom surface and is in contact with the first end surface of the projection, and
     a second lateral surface which is continuous with the bottom surface and is in contact with the second end surface of the projection, and
   as viewed from a lateral wall side, the first end surface and the first lateral surface extend to be inclined in a first direction, and the second end surface and the second lateral surface extend in a second direction intersecting the first direction.

2. The semiconductor device according to claim 1, wherein as viewed from the lateral wall side, the first end surface and the second end surface of the projection are disposed in a V shape, and the first lateral surface and the second lateral surface of the recess are disposed in a V shape.

3. The semiconductor device according to claim 1, wherein as viewed from the lateral wall side, the first end surface and the second end surface of the projection are disposed in an inverted V shape, and the first lateral surface and the second lateral surface of the recess are disposed in an inverted V shape.

4. The semiconductor device according to claim 1, wherein
   the element-side terminal includes a first terminal and a second terminal,
   the case-side terminal includes a third terminal and a fourth terminal,
   the projection is formed in the first terminal and the second terminal,
   the recess is formed in the third terminal and the fourth terminal,
   the projection of the first terminal comes into contact with the recess of the third terminal,
   the projection of the second terminal comes into contact with the recess of the fourth terminal,
   the projection of the first terminal includes the first end surface,
   the projection of the second terminal includes the second end surface,
   the recess of the third terminal includes the first lateral surface, and
   the recess of the fourth terminal includes the second lateral surface.

5. The semiconductor device according to claim 1, wherein
   the case-side terminal includes a connecting portion which is continuous with the second portion and is connected to the case, and
   the connecting portion includes a bent portion in a cross section extending along a surface of a region of the case which is connected with the connecting portion.

6. A method of manufacturing a semiconductor device, the method comprising:
   preparing a semiconductor element having an element-side terminal and a case having a lateral wall,
     the case being connected with a case-side terminal,
     the element-side terminal including a first portion to come into contact with the case-side terminal,
     the first portion including a projection,
     the case-side terminal including a second portion which faces the lateral wall and extends along the lateral wall,
     the second portion including a recess to come into contact with the projection,
     the projection including
       a top surface facing the lateral wall,
       a first end surface continuous with the top surface, and
       a second end surface continuous with the top surface,
     the recess including
       a bottom surface facing the top surface of the projection,
       a first lateral surface which is continuous with the bottom surface and is to be in contact with the first end surface of the projection, and
       a second lateral surface which is in continuous with the bottom surface and is to be in contact with the second end surface of the projection;
   disposing the semiconductor element in the case with the projection being in contact with the recess,
     in the disposing of the semiconductor element, as viewed from a lateral wall side, the first end surface and the first lateral surface extend to be inclined in a first direction, and the second end surface and the second lateral surface extend to be inclined in a second direction intersecting the first direction; and
   fixing the first portion and the second portion with the projection being in contact with the recess.

7. A power converter comprising:
   a main conversion circuit including a semiconductor device according to claim 1 and configured to convert power supplied thereto and output the power; and
   a control circuit configured to output a control signal for controlling the main conversion circuit to the main conversion circuit.

* * * * *